United States Patent [19]

Taguchi et al.

[11] Patent Number: 5,218,262
[45] Date of Patent: Jun. 8, 1993

[54] APPARATUS FOR RETAINING AN ELECTRODE BY A MAGNETICALLY SHIELDED MAGNET

[75] Inventors: Masami Taguchi, Minneapolis; Charles A. Brantingham, St. Paul, both of Minn.

[73] Assignee: The Perkin-Elmer Corporation, Norwalk, Conn.

[21] Appl. No.: 863,640

[22] Filed: Apr. 6, 1992

[51] Int. Cl.⁵ .................... H01J 1/92; H01J 37/285
[52] U.S. Cl. .................... 313/237; 313/153; 313/240; 313/336; 250/311
[58] Field of Search ............... 313/237, 152, 240, 336, 313/153; 250/311

[56] References Cited

U.S. PATENT DOCUMENTS 2,233,194  2/1941  Atlee et al. .................. 313/152 X
5,021,702  6/1991  Miyoshi et al. ................ 313/336 X Primary Examiner—Palmer C. Demeo
Attorney, Agent, or Firm—H. S. Ingham; E. T. Grimes

[57] ABSTRACT

In an electrode assembly, an electrode holder has a forward end thereof affixed coaxially to an electrode tip. An attachment member is affixed to the holder rearwardly of the electrode. A retaining assembly includes an outer cup component, an inner cup component and a magnet therein. An electrical lead is connected to the inner cup component. The electrode assembly fits coaxially into the retaining assembly with the attachment member adjacent to and retained by the magnet. The electrode holder is seated in electrical contact with the inner cup component. The holder, cup components and attachment member are magnetically permeable, and separated in each assembly by insulators, so as to effect an outer magnetic shielding loop and an inner magnetic shielding loop.

8 Claims, 1 Drawing Sheet

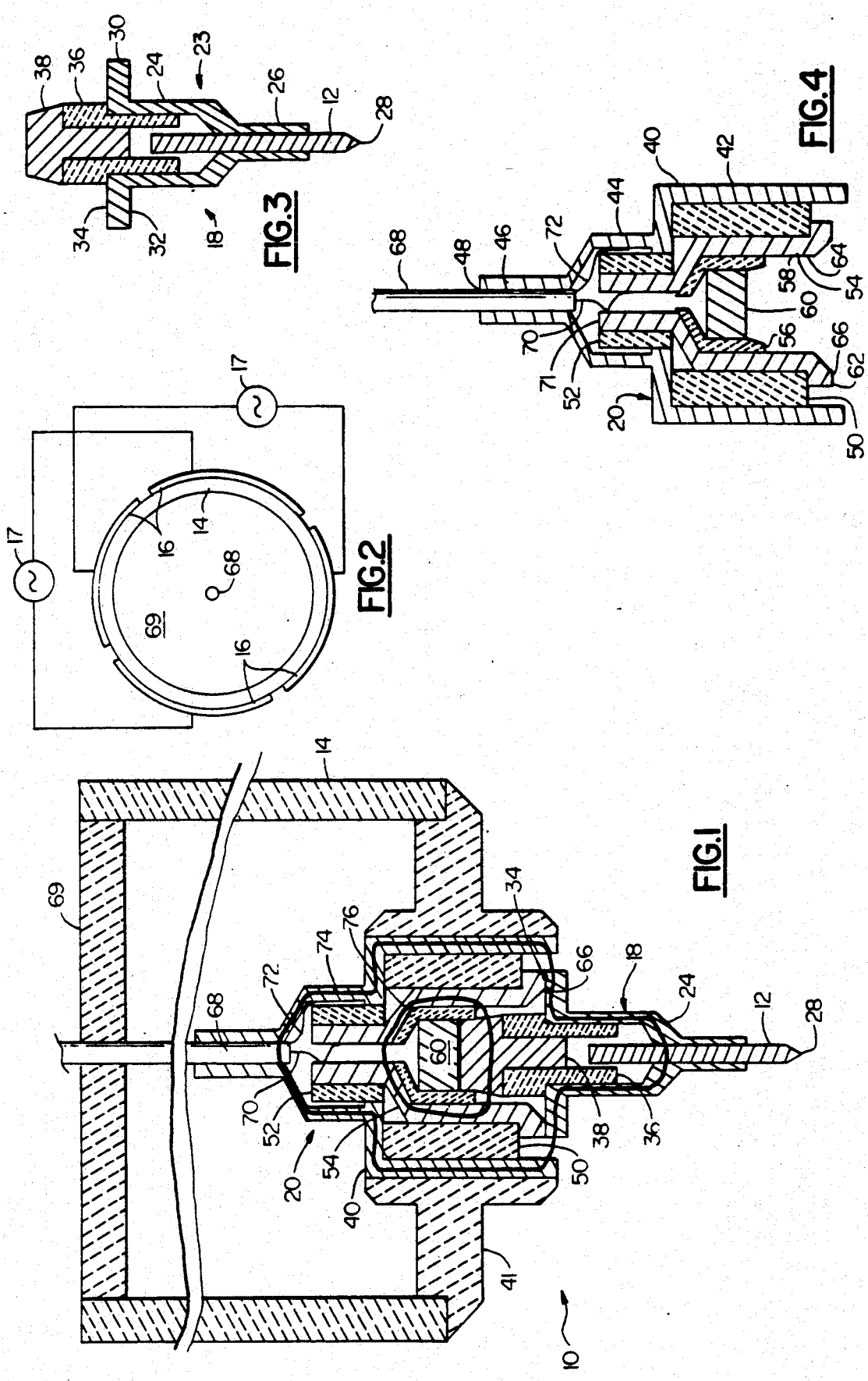

APPARATUS FOR RETAINING AN ELECTRODE BY A MAGNETICALLY SHIELDED MAGNET

This invention relates to instruments and the like that utilize electrodes, and particularly to an apparatus for retaining an exchangeable electrode assembly in position by a magnetically shielded magnet.

BACKGROUND OF THE INVENTION

Precision instruments such as a scanning tunneling microscope (STM) generally operate with ultra high vacuum. Positioning and repositioning of components is carried out remotely and requires special precautions for the in-vacuum procedures. Such repositioning may require high precision of placement. The STM, for example, can analyze surfaces down to atomic accuracy and has some very small components including a metal probing tip mounted only 0.1 mm above the sample surface. Descriptions of some of the mechanical requirements for a STM are given in an article "In Situ Tip Exchange Mechanism For The Demuth-type Scanning Tunneling Microscope" by K. Yokoyama, T. Hashizume, H. Tanaka, I. Sumita, M. Takao and T. Sakurai, J. Vac Sci. Technol. B9 (2), 623–625 (1991).

The tips are replaced frequently, preferably Without interrupting the vacuum. Therefore, advantageously a carrier is located in the chamber to carry a number of tips. In replacing a tip, the carrier is moved to a position adjacent to the tip holder. The carrier would have positions for the tips arranged so that selection of a tip is effected by a selected orientation of the carrier.

Magnetic retention of an assembly with the electrode tip is particularly useful in such an arrangement, because the carrier can merely position a tip assembly near a magnetic holder and retention is effected magnetically into the holder without gripping mechanisms being required. Similarly the carrier can have a simple slot or the like for connecting to the assembly to pull it away for disengagement from the holder. However, magnetic fields from any magnet in the holder would interfere with other surface analysis techniques generally associated with an STM, such as Auger electron spectroscopy and X-ray photoelectron spectroscopy. Simple, conventional magnetic shielding has been found to be insufficient, and additional shielding components would interfere in the utilization of a tip at a sample surface.

Therefore, an object of the invention is to provide a novel apparatus for retaining an exchangeable electrode assembly in position by a magnetically shielded magnet. A further object is to provide such an apparatus with highly efficient shielding of magnetic fields. Another object is to provide such an apparatus with efficient shielding without extraneous components at the electrode.

SUMMARY OF THE INVENTION

The foregoing and other objects are achieved with an apparatus comprising an electrode assembly and a retaining assembly, each being of coaxial configuration.

In the electrode assembly, an electrode member includes a forward, electrode portion and a rearward tubular portion of magnetically, permeable material. A magnetically permeable attachment member is retained tandemly rearward of the electrode. A connecting means such as a non-magnetic insulating member is disposed to connect the attachment member coaxially to the electrode holder separated therefrom.

The retaining assembly comprises magnetic components comprising a magnetically permeable outer cup component, a magnetically permeable inner cup component disposed within the outer cup component, and a bar magnet component disposed within the inner cup component. The retaining assembly further comprises securing means for securing said magnetic components coaxially generally separated from one another. The inner cup component is annularly constricted rearward of the magnet. The outer cup component has an annularly constricted terminus rearward of the inner cup component.

The retaining assembly preferably includes an electrical cable with a primary electrical lead passing through an orifice in the outer cup component and connected electrically to the inner cup component. A secondary electrical lead at ground potential, from the outer sheath of the cable, is connected to the outer cup component to effect electrical shielding.

The electrode assembly is adapted to fit coaxially into the retaining assembly with the attachment member adjacent to the magnet component, with the tubular portion of the electrode member seated annularly on the inner cup component in electrical contact therewith. Thus the electrode assembly is retained in the retaining assembly by the magnet with double magnetic shielding. An outer magnetic shielding loop is effected by the outer cup component and the tubular portion, and an inner magnetic shielding loop is effected by the inner cup component and the attachment member.

BRIEF DESCRIPTION OF THE DRAWINGS

FIG. 1 is a vertical section of an apparatus according to the invention.

FIG. 2 is a top view of the apparatus of FIG. 1.

FIG. 3 is a vertical section of an electrode assembly of the apparatus of FIG. 1.

FIG. 4 is a vertical section of a retaining assembly of the apparatus of FIG. 1.

DETAILED DESCRIPTION OF THE INVENTION

FIG. 1 illustrates an apparatus o of the invention which is suitable, for example, for use in a scanning tunneling microscope (STM). In such an instrument it is desirable to be able to readily replace and retain in place with precision an electrode tip which is to be held in very close proximity to a sample surface.

In an STM application, the electrode tip 12 is held in conjunction with a coaxial tube 14 of piezoelectric material such as $Pb(Zr,Ti)O_3$ which has on the outside surface a plurality of longitudinal conductive layers of silver or the like coated thereon. The layers, e.g. in four sectors 16 (FIG. 2) for rectilinear motion, are receptive of at least one oscillatory voltage 17 (two shown) to effect oscillatory motion of the electrode in the conventional manner. However, although generally directed herein to an STM, it will be appreciated that the tip retaining apparatus of the invention is suitable for any other instrument where it useful to removably retain an electrode magnetically with magnetic shielding of the retaining means.

The apparatus generally comprises an electrode assembly 18 and a retaining assembly 20. Both assemblies are of coaxial configuration, and can be fitted together axially as indicated.

The electrode assembly 8 (FIG. 3) comprises an electrode member 23 and an attachment member 38. In the electrode member (which is formed of all components of assembly 18 other than the attachment member 38), a central forward electrode portion, viz. the electrode 12 is held by a magnetically permeable rearward tubular portion, viz. a tubular electrode holder 24. The forward end 26 of the holder is affixed by swaging coaxially to the electrode in physical and electrical contact therewith, so as to expose a forward end tip 28 of the electrode. The rearward end 30 of the holder has a flange 32 with a smooth surface 34 facing rearwardly.

(As used herein and in the claims the terms "forward" and "forwardly" denote an axial direction or end of a component toward the exposed tip, and "rearward" and "rearwardly" denote the opposite. Similarly, the term "inner" denotes a radial direction toward the axis, and "outer" denotes away from the axis.)

The holder 24 is tubular rearwardly so as to accommodate a tubular, non-magnetic member 36 therein, conveniently formed of aluminum. The magnetically permeable attachment member 38 is retained tandemly and axially rearward of the electrode 12 by the member 36. The components of the assembly are tightly fitted and cemented with a conventional high temperature expoxy (except for the swaging on the tip) so that the attachment member 38 is connected to the electrode holder 24 separated by the member 36.

Magnetic and insulating components in the retaining assembly 20 (FIG. 4) are arranged coaxially and also affixed with cement. On the outside, an outer cup component 40 of magnetically permeable material is held by an insulating ring 4 (FIG. 1) to the piezoelectric tube 14. Member 40 narrows from a larger cup stage 42 rearwardly to an intermediate cup stage 44, and then further rearwardly to an annularly constricted terminus 46 with an axial orifice 48 therethrough. A non-magnetic outer insulating cylinder 50 is fitted into the larger cup stage 42. A smaller such insulating cylinder 52 is fitted into the intermediate cup stage 44. (In a variation, not shown, the outer and the smaller insulating cylinders may be formed as a single unit.) A magnetically permeable inner cup component 54 is fitted within the outer insulating cylinder 50 and constricts rearwardly to extend into the smaller cylinder 52. A non-magnetic inner insulator 56 is retained in the cup portion 58 of the inner cup component, and a short bar magnet 60 is retained within the inner insulator. The inner cup component has a flare 62 at its forward end 64 with a smooth surface 66 facing forwardly. The insulating components in this assembly constitute securing means for the magnetic components.

A coaxial electrical cable 68 enters the retaining assembly 20 through a support disk 69 (FIG. 1) and the axial orifice 48 (FIG. 4). The primary (central) electrical lead 70 of the cable is connected electrically by soldering it into the constricted end 71 of the inner cup component A secondary electrical lead 72 from the coaxial sheath conductor of the cable is connected to the outer cup component 40 by being pressed between the intermediate stage 44 and the smaller insulator 52. The cable sheath and thereby the outer member are preferably maintained at ground potential to continue electrical shielding of the inner current carrying components.

With reference to FIG. 1, the electrode assembly 18 is adapted to fit coaxially into the retaining assembly 20 with the attachment member 38 adjacent to the magnet 6, so that the electrode assembly is retained by the attraction between the magnet and the permeable attachment member. The smooth surfaces 34,36 of the holder flange and the inner cup provide annular seating between the assemblies, with insulator 56 providing axial alignment. The surfaces also are in electrical contact so that electrical continuity is provided from the primary lead 70 to the electrode tip 28.

Double magnetic shielding of the magnet and its field is provided in two concentric, cylindrically configured loops. An outer magnetic shielding field 74 is effected by the electrode holder 24 and the outer cup component 40, and an inner magnetic shielding field 76 is effected by the attachment member 38 and the inner cup component 54. A particular feature of the invention is that components in the electrode assembly, viz. the holder 24 and the attachment member 38, also serve as components in the shielding loops, thereby reducing critical space requirements near the tip.

The electrode tip material is selected for its use, for example tungsten for an STM. The permeable components may be soft iron but are advantageously a nickel-molybdenum alloy for a vacuum environment, such as Hy Mu 80 (TM) of Carpenter Steel Company. A suitable magnet is made of conventional samarium-cobalt alloy. The insulating components are conveniently formed of Macor (TM) machinable ceramic. Also, within the purview of the invention under some circumstances (generally not an STM) the electrode may be of the same permeable material as the electrode holder, and so the holder and electrode may be a single unitary component.

In an STM incorporating an electrode tip in a holder according to the foregoing invention, very low tunneling current (0.05 nA) and very low leakage of magnetic field at the tip end (r50 mG) have been achieved. Moreover, the electrode assembly is readily exchangeable by any convenient manipulator which can grip the assembly to pull it out of the holder, and place the same or another electrode assembly into the holder for retention.

While the invention has been described above in detail with reference to specific embodiments, various changes and modifications which fall within the spirit of the invention and scope of the appended claims will become apparent to those skilled in this art. Therefore, the invention is intended only to be limited by the appended claims or their equivalents.

I claim:

1. An apparatus for retaining an electrode by a magnetically shielded magnet, the apparatus comprising an electrode assembly and a retaining assembly, wherein:

the electrode assembly comprises an electrode member including a forward electrode portion and a rearward tubular portion of magnetically permeable material, a magnetically permeable attachment member retained tandemly rearward of the electrode portion, and connecting means disposed to connect the attachment member coaxially to the electrode member generally separated therefrom; and the retaining assembly comprises magnetic components comprising a magnetically permeable outer cup component, a magnetically permeable inner cup component disposed within the outer cup component, and a bar magnet component disposed within the inner cup component, and the retaining assembly further comprises securing means for securing said magnetic components coaxially generally separated from one another, the inner cup member being annularly constricted rearwardly of the magnet component, and the outer cup component having an annularly constricted terminus rearwardly of the inner cup component;

the electrode assembly being adapted to fit coaxially into the retaining assembly with the attachment member adjacent to the magnet component, such that the electrode assembly is retained in the retaining assembly by the magnet component, an outer magnetic shielding loop is effected by the outer cup component and the tubular portion, and an inner magnetic shielding loop is effected by the inner cup component and the attachment member.

2. The apparatus of claim 1 wherein the forward electrode portion comprises a central electrode, and the rearward tubular portion comprises a magnetically permeable electrode holder affixed coaxially to the electrode in electrical contact therewith so as to expose a forward end of the electrode.

3. The apparatus of claim 2 wherein, with the electrode assembly fitted in the retaining assembly, the tubular portion is seated annularly on the inner cup component in electrical contact therewith.

4. The apparatus of claim 3 further comprising an electrical cable with a primary electrical lead passing through an orifice in the outer cup component and connected electrically to the inner cup component.

5. The apparatus of claim 4 wherein the cable includes a secondary electrical lead at ground potential connected to the outer cup component to effect electrical shielding.

6. The apparatus of claim 2 wherein the electrode is a scanning tunneling microscope electrode tip.

7. The apparatus of claim 1 wherein the connecting means comprises a non-magnetic electrically insulating member disposed to connect the tubular portion to the attachment member, and the securing means comprise non-magnetic electrically insulating components disposed between respective magnetic components.

8. The apparatus of claim 1 further comprising an insulator ring affixed to the outer cup component, a piezoelectric tube affixed to the insulator ring, and a plurality of electrode layers attached to the piezoelectric tube and being receptive of at least one oscillatory voltage to effect oscillatory motion of the electrode.

* * * * *

UNITED STATES PATENT AND TRADEMARK OFFICE
CERTIFICATE OF CORRECTION

PATENT NO. : 5,218,262
DATED : June 8, 1993
INVENTOR(S) : Masami Taguchi, et. al.

It is certified that error appears in the above-indentified patent and that said Letters Patent is hereby corrected as shown below:

Column 2, line 7, after "securing" delete "10".
Column 2, line 43, change "o" to --10--.
Column 2, line 67, change "8" to --18--.
Column 3, line 31, change "4" to --41--.
Column 3, line 67, cahnge "6" to --60--.

Signed and Sealed this

Nineteenth Day of July, 1994

Attest:

BRUCE LEHMAN

Attesting Officer        Commissioner of Patents and Trademarks